(12) United States Patent
Watanabe

(10) Patent No.: US 7,932,848 B2
(45) Date of Patent: Apr. 26, 2011

(54) PULSE DELAY CIRCUIT AND A/D CONVERTER INCLUDING SAME

(75) Inventor: Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/653,186

(22) Filed: Dec. 9, 2009

(65) Prior Publication Data

US 2010/0149016 A1    Jun. 17, 2010

(30) Foreign Application Priority Data

Dec. 12, 2008 (JP) .................................. 2008-316969

(51) Int. Cl.
*H03M 1/60* (2006.01)
(52) U.S. Cl. ........................................ 341/157; 327/182
(58) Field of Classification Search .......... 341/140–160; 327/23, 134–289
See application file for complete search history.

(56) References Cited

U.S. PATENT DOCUMENTS

| | | | |
|---|---|---|---|
| 5,396,247 | A | 3/1995 | Watanabe et al. |
| 5,477,196 | A | 12/1995 | Yamauchi et al. |
| 6,771,202 | B2 | 8/2004 | Watanabe et al. |
| 6,879,278 | B2 | 4/2005 | Watanabe et al. |
| 7,248,197 | B2 | 7/2007 | Watanabe |
| 7,292,176 | B1 * | 11/2007 | Chen et al. ............... 341/157 |
| 7,679,333 | B2 * | 3/2010 | Goto ........................ 327/261 |

FOREIGN PATENT DOCUMENTS

| | | |
|---|---|---|
| JP | 05-259907 | 10/1993 |
| JP | 07-183800 | 7/1995 |
| JP | 2004-007385 | 1/2004 |
| JP | 2004-357030 | 12/2004 |
| JP | 2005-322327 | 11/2005 |
| JP | 2007-006368 | 1/2007 |
| JP | 2007-006369 | 1/2007 |

OTHER PUBLICATIONS

Office action dated Aug. 24, 2010 in corresponding Japanese Application No. 2008-316969.

* cited by examiner

*Primary Examiner* — Lam T Mai
(74) *Attorney, Agent, or Firm* — Harness, Dickey & Pierce, PLC

(57) ABSTRACT

The pulse delay circuit includes a plurality of delay units connected in series or in a ring, each of the delay units being constituted of at least one inverter gate circuit grounded to a ground line, and configured to delay a pulse signal passing therethrough by a delay time thereof depending on an input signal applied thereto, and a capacitor connected between a signal line through which the voltage signal is applied to each of the delay units and the ground line. The capacitor serves as a current source to supply a current which each of the delay units consumes to invert a state thereof.

10 Claims, 6 Drawing Sheets

PULSE DELAY CIRCUIT AND A/D CONVERTER INCLUDING SAME

CROSS-REFERENCE TO RELATED APPLICATION

This application is related to Japanese Patent Application No. 2008-316969 filed on Dec. 12, 2008, the contents of which are hereby incorporated by reference.

BACKGROUND OF THE INVENTION

1. Field of the Invention

The present invention relates to a pulse delay circuit constituted of a plurality of delay units each of which is configured to delay a pulse signal inputted thereto by a delay time depending on the voltage level of an input voltage signal applied thereto, and an A/D converter including the pulse delay circuit.

2. Description of Related Art

There is known an A/D converter of the pulse delay type (TAD type), which is entirely constituted of digital circuits.

The A/D converter of the TAD type includes a pulse delay circuit constituted of delay units connected in series or in a ring each of which is configured to delay a pulse signal inputted thereto by a delay time depending on the voltage level of an input voltage signal applied thereto. This A/D converter outputs numerical data showing the number of the delay units which the pulse signal has passed through as A/D converted data. The A/D converter of the TAD type can be manufactured easily and at low cost by use of the CMOS digital circuit manufacturing technique, because it is constituted of digital circuits only.

Incidentally, for the A/D converter of the TAD type to operate stably, it is necessary that all the delay units constituting the pulse delay circuit have a uniform delay time, so that the pulse signal travels while being uniformly delayed in succession (see FIG. 6A). FIG. 6A is a diagram schematically showing variation of the output level of each of the delay units when the pulse signal travels in the pulse delay circuit. In this figure, "Pi" denotes a delay pulse outputted from the i-th stage delay unit when the pulse signal has passed through this i-th stage delay unit.

Meanwhile, with the progress of CMOS circuit miniaturization, the effects of manufacturing tolerance and minute dust during a transistor forming process on the performance of the formed transistors is becoming larger. If there is large transistor-to-transistor variation in driving capacity, since there occurs large unit-to-unit variation in delay time as shown in FIG. 6B, the resolution of A/D converted data (the voltage width of the input voltage signal corresponding to 1 LSB) varies to an unallowable extent.

To cope with such a problem, it is known to make the transistors constituting the pulse delay circuit which affects the resolution of A/D converted data larger in size than the transistors constituting other circuits or units of the A/D converter which do not affect the resolution of A/D converted data, in order to lessen the effects of manufacturing tolerance or minute dust on the performance of the transistors constituting the pulse delay circuit. For example, refer to Japanese Patent application Laid-open No. 2007-6369.

However, since each of the delay units constituting the pulse delay circuit is usually constituted of CMOC inverter gate circuits, switching noise is superimposed on the power supply line of the delay units, that is the signal line through which the input voltage signal is applied to each delay unit, each time the output of each CMOS inverter gate circuit inverts its state.

Accordingly, when the transistors constituting the pulse delay circuit are made large in size, the switching noise increases because electric power consumed by each delay unit increases.

As a result, since the level of the input voltage signal varies greatly due to the switching noise, there occurs variation in delay time among the delay units as shown in FIG. 6B, the pulse delay circuit cannot output the delay signals P1, P2, . . . at even time intervals while the pulse signal travels in the pulse delay circuit.

SUMMARY OF THE INVENTION

The present invention provides a pulse delay circuit comprising:

a plurality of delay units connected in series or in a ring, each of the delay units being constituted of at least one inverter gate circuit grounded to a ground line, and configured to delay a pulse signal passing therethrough by a delay time thereof depending on an input signal applied thereto; and a capacitor connected between a signal line through which the voltage signal is applied to each of the delay units and the ground line;

the capacitor serving as a current source to supply a current which each of the delay units consumes to invert a state thereof.

According to the present invention, there are provided a pulse delay circuit capable of outputting delay signals at uniform intervals, and an A/D converter capable of outputting A/D converted data with high resolution.

Other advantages and features of the invention will become apparent from the following description including the drawings and claims.

PREFERRED EMBODIMENTS OF THE INVENTION

First Embodiment

Figure 1A:
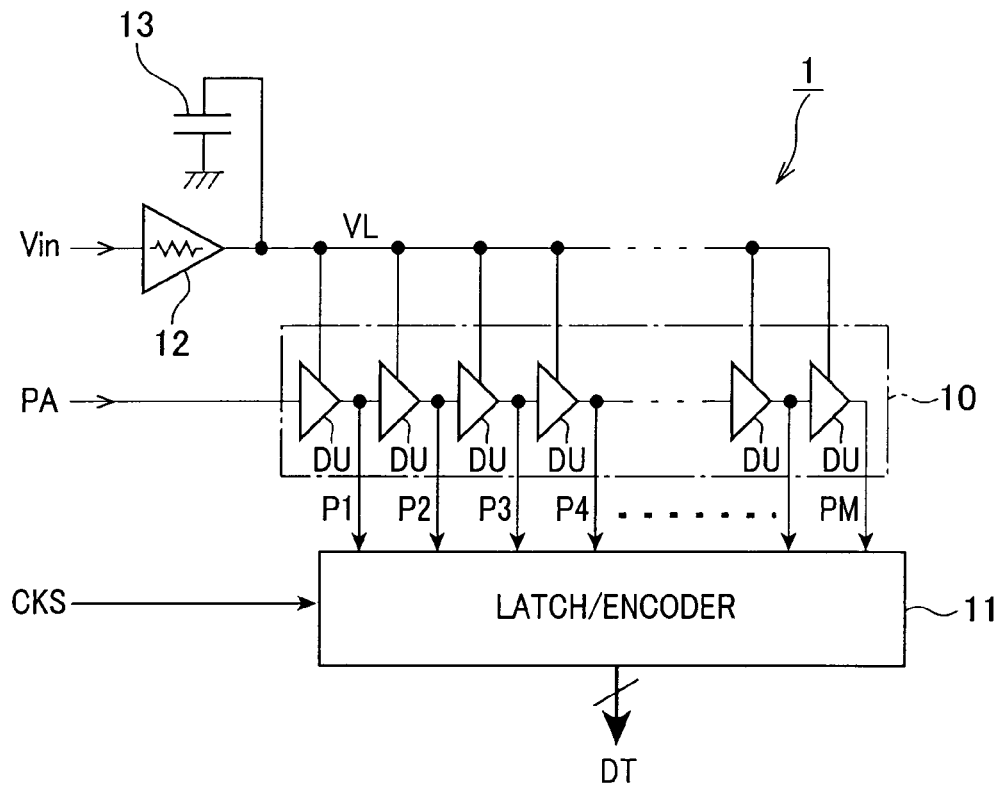
FIG. 1A is a diagram showing the overall structure of an A/D converter including a pulse delay circuit according to a first embodiment of the invention.

FIG. 1A is a diagram showing the overall structure of an A/D converter 1 including a pulse delay circuit 10 according to a first embodiment of the invention.

As shown FIG. 1A, the A/D converter 1 includes the pulse delay circuit 10 as an SDL (straight delay line) and a latch/encoder 11 as an encoder circuit. The pulse delay circuit 10 is constituted of M (M being an integer larger than 2) cascade-connected delay units DU each of which delays a pulse signal PA passing therethrough. The latch/encoder 11 detects (latches) a reached position of the pulse signal PA within the pulse delay circuit 10, and outputs digital data (A/D converted data) DT formed of a predetermined number of bits which indicates what stage number of the delay unit DU the pulse signal PA has reached. In the drawings, "Pi"(i=1, 2, ... M) denotes the output (delay signal) of the i-th stage delay unit DU.

Figure 1B:
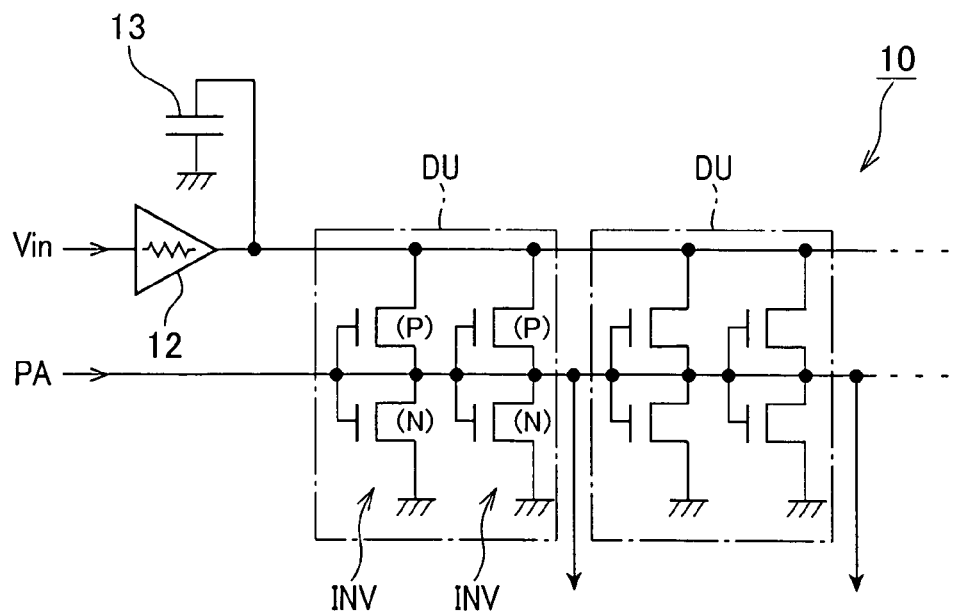
FIG. 1B is a diagram showing the structure of delay units constituting the pulse delay circuit.

As shown in FIG. 1B, each delay unit DU is constituted of first and second CMOS inverter gate circuits INV which are cascade-connected. Each of the first and second CMOS inverter gate circuits INV is constituted of a P channel MOSFET and an N channel MOSFET series-connected between a signal line and a ground line.

Each delay unit DU is applied with an input voltage signal Vin as an A/D conversion target by way of a buffer 12 whose output terminal is connected to the signal line. The pulse signal PA is applied to the control terminals of the first CMOS inverter gate circuit INV of the first stage delay unit DU. The connection node of the second CMOS inverter gate circuit INV is connected to the control terminals of the first CMOS inverter gate circuit INV of the following stage delay unit DU. The delay time of each delay unit DU depends on the voltage level of the input voltage signal Vi. Accordingly, the number of the delay units DU which the pulse signal PA passes through during one period of a sampling clock CKS (a sampling period TS) is in proportion to the voltage level of the input voltage signal Vin (to be more precise, the mean voltage level of the input voltage signal Vin during the sampling period TS).

Between the signal line and the ground line, a capacitor 13 is connected. The capacitance C of the capacitor 13 is set to such a value that the time constant determined by the output resistance R of the buffer 12 and the capacitance C of the capacitor 13 is smaller than the reciprocal of an allowable maximum frequency of the input voltage signal Vin (or a wavelength period of a signal component having the allowable maximum frequency of the input voltage signal Vin).

The latch/encoder 11 includes at least a latch circuit for latching the outputs (delay signals) P1 to PM of the M delay units DU constituting the pulse delay circuit 10, and an encoder for converting the output of the latch circuit into digital data DT. The latch circuit and the encoder operate on a constant power supply voltage.

All the parts of the A/D converter 1 including the capacitor are formed as a semiconductor integrated circuit on a semiconductor substrate (IC chip) by use of a CMOS manufacturing process.

The latch/encoder 11 which serves as a logical operation unit of the A/D converter 1 is constituted of transistors designed in accordance with the minimum size defined by a CMOS digital circuit design rule adopted in this embodiment (for example, the 90 nm line width standard), while the pulse delay circuit 10 is constituted of transistors designed to have larger size than the transistors constituting the latch/encoder 11, in order that the delay units DU have a uniform delay time.

The buffer 12 and the capacitor 13 are disposed such that the total value of the output resistance of the buffer 12 and the wiring resistance of the signal line leading from the output terminal of the buffer 12 to each delay unit is approximately 1/10 (preferably approximately 1/100) of the on-resistance of each delay unit DU. Accordingly, in this embodiment, they are disposed within 1 mm (preferably, 100 µm) from the pulse delay circuit 10.

Next, the operation of the A/D converter 1 having the above described structure is explained. When the A/D converter 1 is supplied with the pulse signal PA at the first stage delay unit DU, and the sampling clock CKS which rises each time the sampling period TS elapses, the latch/encoder 11 outputs the digital data DT representing the voltage level of the input voltage signal Vin.

Figure 2:
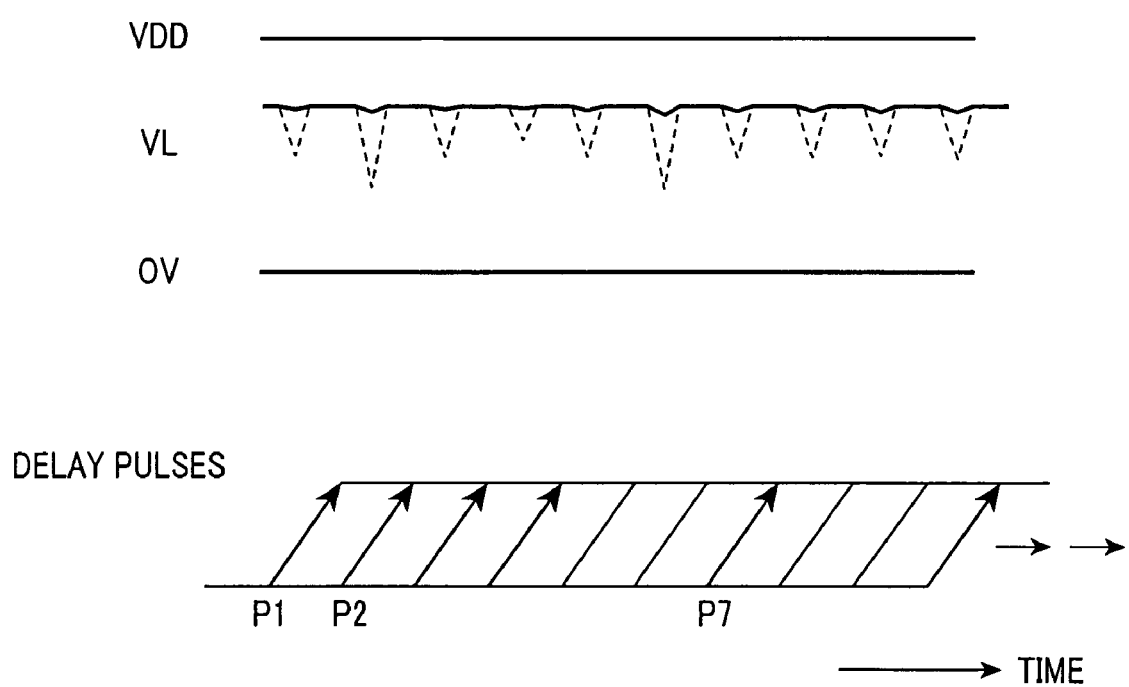
FIG. 2 is a diagram for explaining effects of the capacitor adopted in the first embodiment in comparison with a conventional structure in which no such capacitor is adopted.

FIG. 2 is diagram schematically showing variation with time of the voltage level VL at the signal line through which the output of the buffer 12 is supplied to each delay unit DU. In FIG. 2, the dotted line shows the case in which the capacitor 13 is not provided as in a conventional A/D converter, and the solid line shows the case in which the capacitor 13 is provided as in this embodiment.

As shown in FIG. 2, when the capacitor 13 is not provided, each time the inverter gate circuits INV of each delay unit DU invert their state, an operation current flows through the inverter gate circuits INV (and accordingly through the delay unit DU) momentarily. Since this operation current causes a voltage drop because of the output resistance R of the buffer 12 and the wiring resistance, the voltage level VL drops momentarily. On the other hand, in the case in which the capacitor 13 is provided, since the capacitor 13 supplies a current when the delay unit DU performs switching, causing the current flowing through the buffer 12 to reduce, the extent of the voltage drop due to the output resistance R of the buffer 12 can be reduced.

The first embodiment described above provides the following advantages. The A/D converter 1 is configured such that the capacitor 13 supplies a current equivalent to the operation current which flows momentarily each time each delay unit D inverts its state. Accordingly, the extent of drop of the voltage level VL of the input voltage signal Vin applied to each delay unit DU is greatly reduced, because only very little current flows through the output resistor of the buffer 12 and the wiring resistor on the input side of the buffer 12.

Therefore, according to this embodiment, since the delay units DU can have a uniform delay time, it is possible to generate the A/D converted data with less variation and with high resolution.

In the A/D converter 1, the capacitance C of the capacitor 13 forms a low-pass filter together with the output resistance R of the buffer 12 to cut noise components having frequencies higher than the maximum allowable frequency of the input voltage signal Vin. This enables removing effects (error) of the noise components on the A/D converted data DT.

Further, according to this embodiment, the transistors constituting the pulse delay circuit 10 are smaller in size than other transistors constituting the latch/encoder 11. Accordingly, a percentage of the transistors constituting the pulse delay circuit 10 whose gate pattern areas are out of the design range adopted due to manufacturing tolerance or minute dust can be greatly reduced.

The advantage that the delay units DU can be formed to have a uniform delay time in combination with the advantage of the provision of the capacitor 13 to reduce the extent of drop of the voltage level VL makes it possible to further reduce variation of the resolution or DNL (Differential Non-linearity) error of the A/D converted data DT, to thereby improve yields.

The circuit scale of the pulse delay circuit 10 is smaller than that of the latch/encoder 11. Accordingly, the extent of increase of the circuit scale of the whole A/D converter 1 due to increase in size of the transistors constituting the pulse delay circuit 10 can be very small.

Second Embodiment

Figure 3:
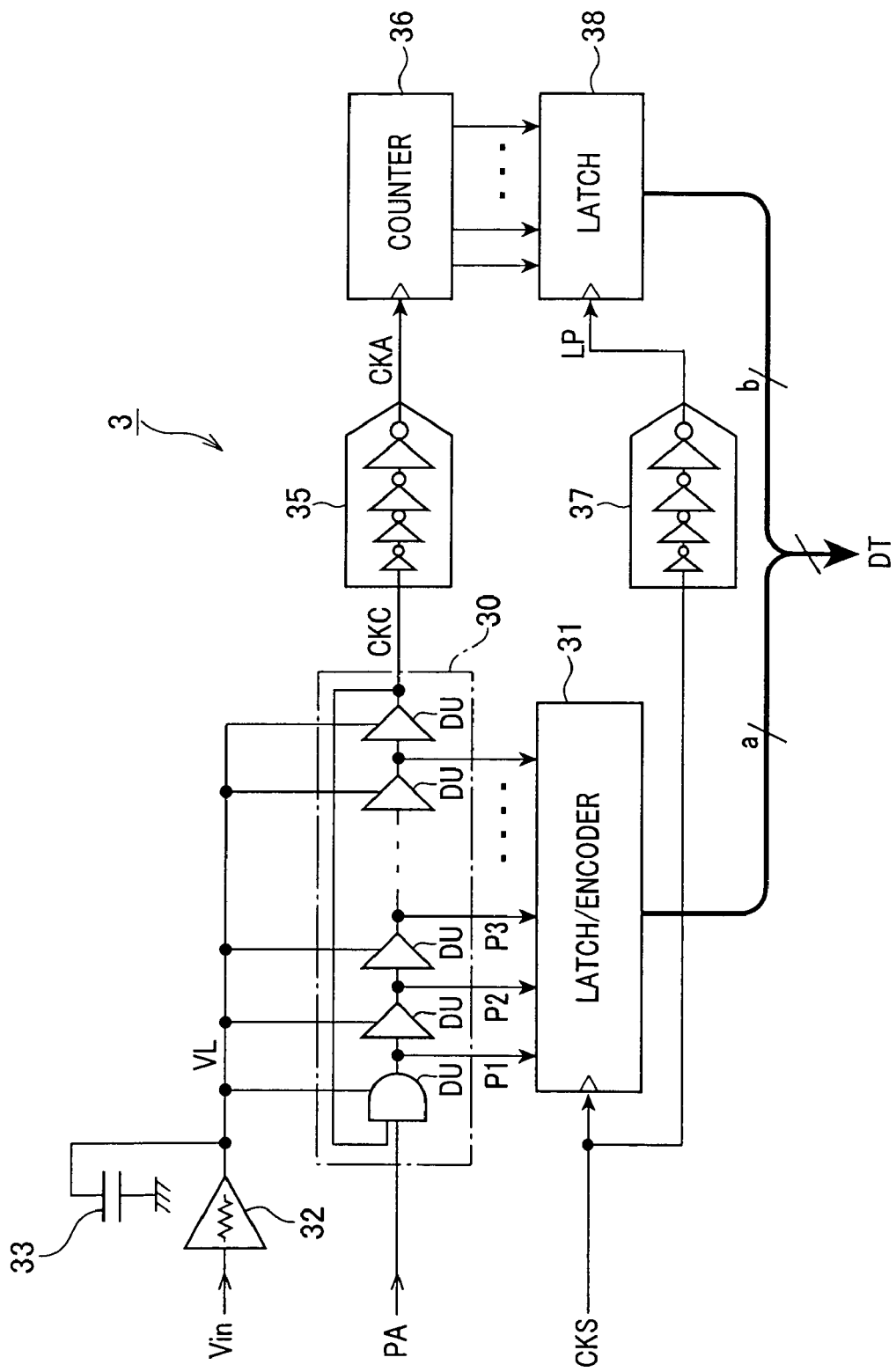
FIG. 3 is a diagram showing the overall structure of an A/D converter including a pulse delay circuit according to a second embodiment of the invention.

Next, a second embodiment of the invention is explained. FIG. 3 is a diagram showing the overall structure of an A/D converter 3 including a pulse delay circuit 30 according to a second embodiment of the invention. As shown in FIG. 3, the A/D converter 3 includes the pulse delay circuit 30 and a latch/encoder 31. The pulse delay circuit 30 is constituted of M (=2a: a being a positive integer) delay units DU connected in a ring to form a ring delay line RDL, each of the delay units DU being configured to delay the pulse signal PA inputted thereto. The latch/encoder 31 detects (latches) a reached position of the pulse signal PA within the pulse delay circuit 30, and outputs digital data (A/D converted data) DT formed of a bits showing what stage number of the delay units DU the pulse signal PA has reached.

The first stage delay unit DU is constituted of an AND gate one input terminal of which serves as a starting terminal. The other delay units DU have the same structure as the delay units DU of the first embodiment. The other input terminal of the first stage delay circuit DU is connected to the output terminal of the final stage delay unit DU. Although not shown in the drawings, the pulse delay circuit 30 is configured to adjust the signal level at the one input terminal of the first stage delay unit DU in order that the pulse signal PA can continue to travel around the pulse delay circuit 30. Since the structure of such a pulse delay circuit as above is well known, for example, from Japanese Patent Application Laid-open No. 6-216721, further explanation of the pulse delay circuit 30 is omitted here.

Each delay unit DU is applied with the input voltage signal Vin to be A/D-converted as a drive voltage through the buffer 32. The delay time of each delay unit DU depends on the voltage level of the input voltage signal Vi. Accordingly, the number of the delay units DU which the pulse signal PA passes through during one sampling period TS of the sampling clock CKS is in proportion to the voltage level of the input voltage signal Vin (to be more precise, the mean voltage level of the input voltage signal Vin during the sampling period TS).

Between the signal line through which the output of the buffer 32 is supplied to each delay unit DU and the ground line, a capacitor 33 is connected. The capacitance C of the capacitor 33 is set to such a value that the time constant determined by the output resistance R of the buffer 32 and the capacitance C of the capacitor 33 is smaller than the reciprocal of an allowable maximum frequency of the input voltage signal Vin (or a wavelength period of a signal component having the allowable maximum frequency of the input voltage signal Vin).

The A/D converter 3 includes a circulation number counter 36, a latch circuit 38, a drive buffer circuit 35, and a delay buffer circuit 37. The circulation number counter 36 is constituted of a b-bit (b being a positive integer) synchronous counter which performs counting operation in accordance with an operating clock CKA. The latch circuit 38 latches the count value of the circulation number counter 36 at timings at which a latch pulse LP rises. The drive buffer circuit 35 is inputted with the output of the final stage delay unit DU as a circulation clock CKC, and supplies it from its output terminal to the circulation number counter 36 as the operating clock CKA. The delay buffer circuit 37 is inputted with the sampling clock CKS, and supplies it from its output terminal to the latch circuit 38 as the latch pulse LP.

The drive buffer circuit 35 is constituted of a plurality of cascade-connected CMOS inverter gate circuits. The final stage inverter gate circuit has a driving capacity sufficiently large with respect to the input capacitance of the clock line of the circulation number counter 36. The other inverter gate circuits have driving capacities increasing stepwise from the first stage inverter gate circuit.

The delay buffer circuit 37 has the same structure as the drive buffer circuit 35. Accordingly they have the same delay time.

Like the first embodiment, all the parts of the A/D converter 3 including the capacitor 33 are formed as a semiconductor integrated circuit on a semiconductor substrate (IC chip) by use of the CMOS manufacturing process.

Of the components of the A/D converter 3, the latch/encoder 31, circulation number counter 36, latch circuit 38 are designed in accordance with the minimum size defined by the CMOS digital circuit design rule adopted in this embodiment. While the pulse delay circuit 30 whose delay units DU should have the uniform delay time, and also the drive buffer circuit 35 and delay buffer circuit 37 which should have the same delay time are constituted of transistors designed to have larger size than the transistors constituting the latch/encoder 31, circulation number counter 36 or latch circuit 38.

The buffer 32 and the capacitor 33 are disposed such that the total value of the output resistance of the buffer 32 and the wiring resistance of the signal line leading from the output terminal of the buffer 32 to each delay unit is approximately 1/10 (preferably approximately 1/100) of the on-resistance of each delay unit DU. Accordingly, in this embodiment, they are disposed within 1 mm (preferably, 100 μm) from the pulse delay circuit 10.

Next, the operation of the A/D converter 3 having the above described structure is explained. The latch/encoder 31 of the A/D converter 3 operates in the same way as the latch/encoder 11 of the first embodiment. The circulation number counter 36 counts the circulation number of the pulse signal PA circulating around the pulse delay circuit 30 (the number of times that the pulse signal PA has circulated around the pulse delay circuit 30) in accordance with the operating clock CKA. The latch circuit 38 latches the count value of the circulation number counter 36 in accordance with the latch pulse LP.

Since the circulation number counter 36 is supplied with the operating clock CKA through the drive buffer circuit 35, it can operate stably even when the bit number of the circulation number counter 36 is large and the input capacitance of the clock line is large.

The operation timings of the circulation number counter 36 are delayed from the timings of the operating clock CKC outputted from the pulse delay circuit 30 by the delay time by which the circulation clock CKA is delayed within the drive buffer circuit 35. Also, the operation timings of the latch circuit 38 are delayed from the timings of the sampling clock CKS by the delay time by which the latch pulse LP is delayed within the delay buffer circuit 37.

That is, by delaying the timing of latching the count value by the delay time by which the operation timing of the circulation number counter 36 is delayed, the timings at which the latch circuit 38 latches the count value of the circulation number counter 36 in accordance with the latch pulse LP can be made coincident with the timings at which the latch/encoder 31 latches the delay pulses from the pulse delay circuit 30 (the outputs from the delay units) in accordance with the sampling clock CKS.

Upon being inputted with the pulse signal PA, and the sampling clock CKS which rises each time the sampling period TS elapses, the A/D converter 3 outputs (a+b) bit-digital data (A/D converted data DT) formed of the a-bit digital data representing the voltage level of the input voltage signal Vin outputted from the latch/encoder 31 as lower-bit data, and the b-bit digital data representing the count value outputted from the latch circuit 38 as higher-bit data.

The second embodiment described above provides the following advantages. The A/D converter 3 provides the same advantages as the A/D converter 1 of the first embodiment, because the capacitor 33 is provided connected between the signal line supplying the output of the buffer 32 to each delay unit DU and the ground line.

The A/D converter 3 has the structure in which the pulse delay circuit 30 is constituted as a ring delay line, and the number of circulations of the pulse signal PA circulating around the pulse delay circuit 30 is counted by the circulation number counter 36. This makes it possible to greatly reduce the number of stages of the delay units DU.

Further, according to this embodiment, the transistors constituting the pulse delay circuit 30, drive buffer circuit 35 and delay buffer circuit 37 are smaller in size than the other transistors constituting the latch/encoder 31, circulation number counter 36 and latch circuit 38. Accordingly, a percentage of the transistors constituting the pulse delay circuit 30, drive buffer circuit 35 and delay buffer circuit 37 whose gate pattern areas are out of the design range adopted due to manufacturing tolerance or minute dust can be greatly reduced.

The advantage that the delay units DU can be formed to have a uniform delay time with ease in combination with the advantage of the provision of the capacitor 33 to reduce the extent of drop of the voltage level VL, it is possible to further reduce variation of the resolution or DNL (Differential Nonlinearity) error of the A/D converted data DT, and to obtain consistency between the higher-bit data and the lower-bit data of the A/D converted data because of the good delay time consistency between the drive buffer circuit 35 and the delay buffer circuit 37, to thereby improve yields.

Third Embodiment

Next, a third embodiment of the invention is described.

Figure 4:
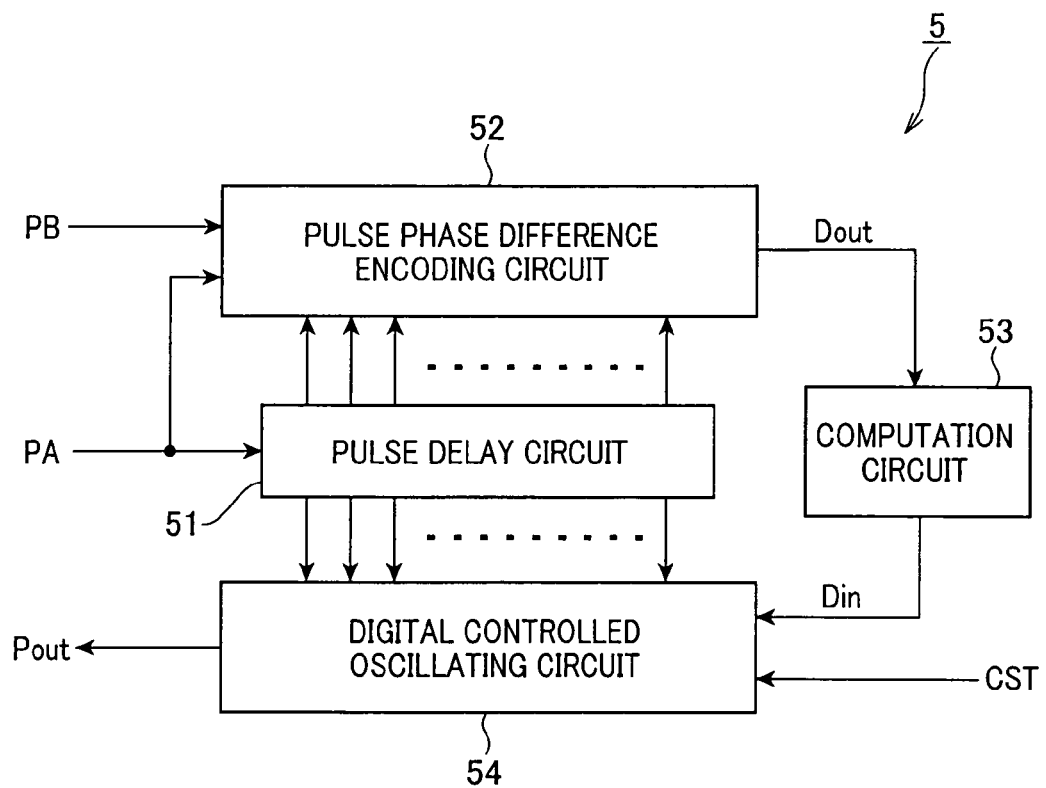
FIG. 4 is a diagram showing the overall structure of a frequency converter as a third embodiment of the invention.

FIG. 4 is a diagram showing an overall structure of a frequency converter 5 as a third embodiment of the invention. The frequency converter 5 is for frequency-dividing or frequency-multiplying a reference signal PB inputted from outside to generate an output signal (pulse signal) Pout of a predetermined frequency.

As shown in FIG. 4, the frequency converter 5 includes a pulse delay circuit 51, a pulse phase difference encoding circuit 52, a computation circuit 53, and a digital controlled oscillation circuit 54. The pulse delay circuit 51 is constituted of a plurality of delay units connected in a ring as a ring oscillator in which the a pulse signal PA circulates while being successively delayed by each delay unit. The pulse phase difference encoding circuit 52 converts a phase difference (or a time period) between a moment at which the reference signal PB rises and a moment at which the reference signal PB rises next into a binary digital value Dout. The computation circuit 53 generates control data Din indicating the output period of a pulse signal Pout to be outputted from the digital controlled oscillation circuit 54 by multiplying or dividing the binary digital value Dout received from the pulse phase difference encoding circuit 52 by a predetermined value. The digital controlled oscillator 54 outputs the pulse signal Pout at intervals equal to the period of the reference signal PB frequency-multiplied or frequency-divided in accordance with the control data Din outputted from the computation circuit 53 and the delay signal successively outputted from the pulse delay circuit 51.

The pulse delay circuit 51 has the structure equivalent to the pulse delay circuit 51 plus the buffer 32 and the capacitor 33 of the second embodiment.

Since the structures of the pulse phase difference encoding circuit 52, computation circuit 53 and digital controlled oscillation circuit 54 are well known from, for example, Japanese Patent Application Laid-open No. 7-183800, further explanations of then are omitted.

In short, the structure in which a capacitor is inserted between the signal line through which the input voltage signal Vin is supplied to each delay unit DU and the ground line can be applied to a frequency converter having a structure described above. It is a matter of course that various modifications can be made to the above described embodiments as described below.

Figure 5A:
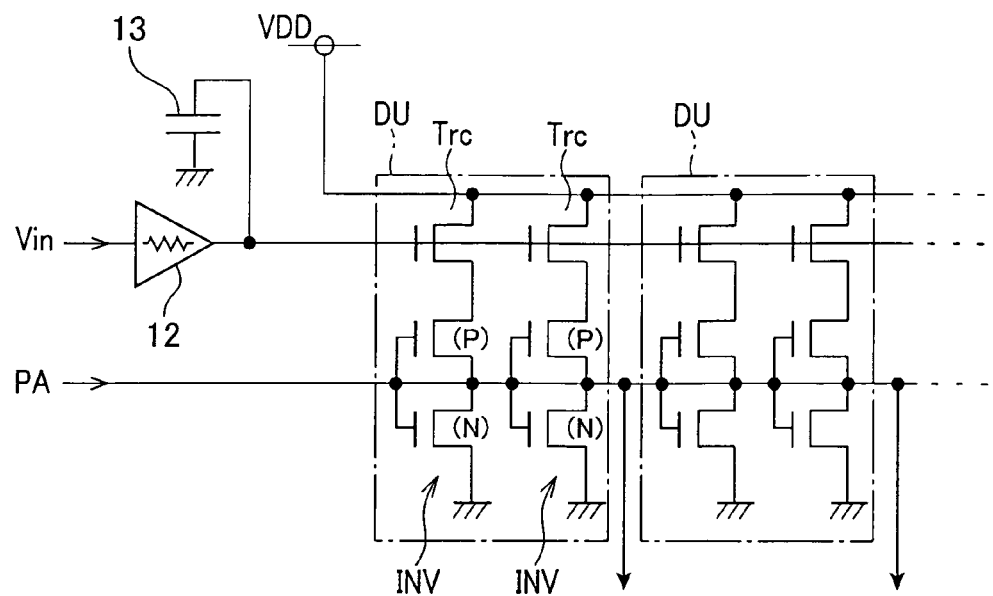
FIGS. 5A and 5B are diagrams showing the structures of modifications of the delay units used in the above embodiments of the invention.

Each of the delay units DU constituting the pulse delay circuit 10 or 30 is described as being constituted of the two cascade-connected CMOS inverter gate circuits INV each including series-connected P-channel transistor (PMOSFET) and N-channel transistor (NMOSFET), and is applied with the input voltage signal Vin at the sources of its P-channel transistors. However, as shown in FIG. 5A, when each CMOS inverter gate circuit INV of each delay unit DU is provided with a control transistor (FET) Trc to enable controlling the drive current from outside, the input voltage signal Vin may be applied to the control terminal of the control transistor Trc as a control signal. In this case, the signal line through which the input voltage signal Vin is supplied to the control transistor of each of the delay units is connected with the buffer 12 or 32 and the capacitor 13 or 33.

In short, sine the operating period of the inverter gate circuit INV varies depending on the drive current supplied from a DC power source, the same advantages as those obtained by the above embodiments can be obtained also by controlling the drive current by the input voltage signal Vin.

In this case, since the input impedance of each delay unit DU increases, the buffer, 12 may be omitted.

Figure 5B:
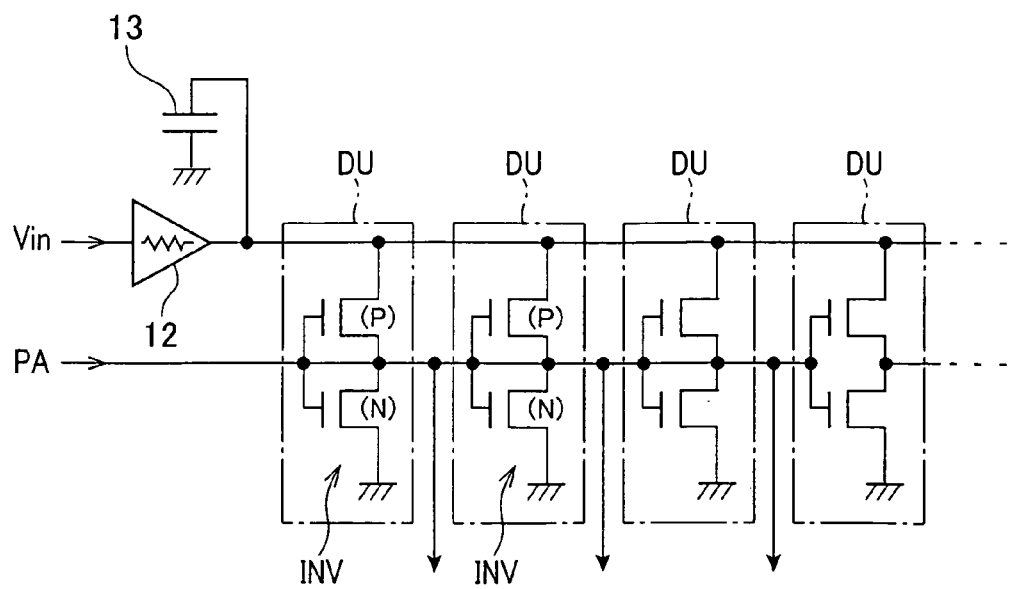
Figure 6A:
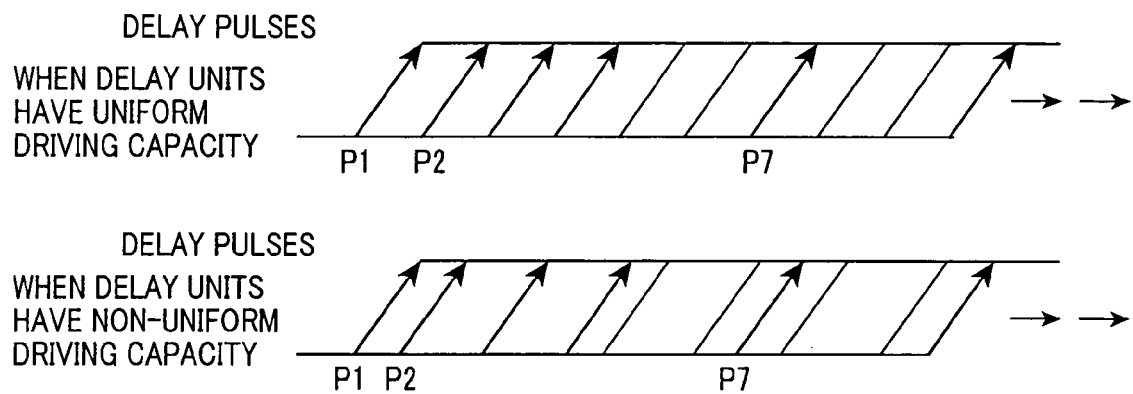
FIGS. 6A and 6B are diagrams explaining the problems of a conventional A/D converter.
Figure 6B:
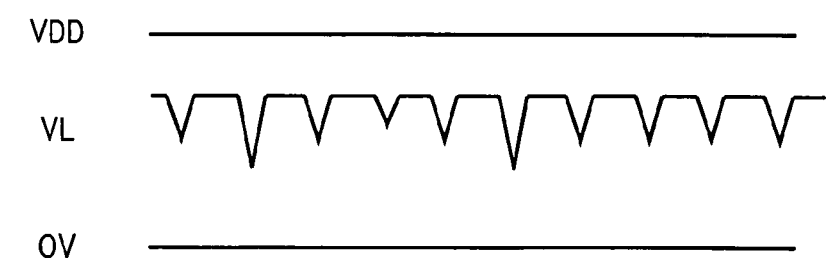
Figure 6B:
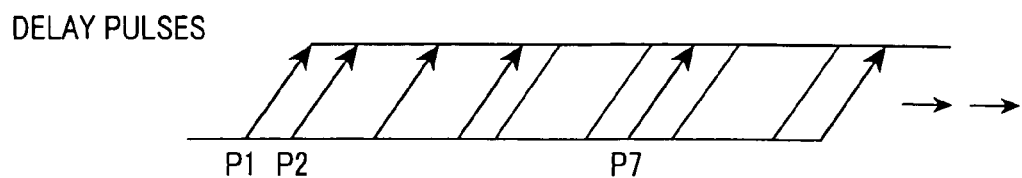

The delay unit DU has not necessarily to be constituted of two cascade-connected inverter gate circuits INV. For example, it may be constituted of only a single inverter gate circuit, as shown in FIG. 5B, or three or more cascade-connected inverter gate circuits.

Further, the delay unit DU does not necessarily have to be constituted of inverter gate circuits. For example, it may be constituted of a standard logic circuit cell, such as an AND gate, an OR gate, a NAND gate, or a NOR gate.

Further, the buffer 12 or 32 may be constituted of just a resistor.

The above explained preferred embodiments are exemplary of the invention of the present application which is described solely by the claims appended below. It should be understood that modifications of the preferred embodiments may be made as would occur to one of skill in the art.

What is claimed is:

1. A pulse delay circuit comprising:
    a plurality of delay units connected in series or in a ring, each of said delay units being constituted of at least one inverter gate circuit grounded to a ground line, and configured to delay a pulse signal passing therethrough by a delay time thereof depending on an input signal applied thereto; and
    a capacitor connected between a signal line through which said input signal is applied to each of said delay units and said ground line;

said capacitor serving as a current source to supply a current which each of said delay units consumes to invert a state thereof.

2. The pulse delay circuit according to claim 1, wherein said signal line is applied with said input signal through a buffer circuit.

3. The pulse delay circuit according to claim 2, wherein a time constant determined by a capacitance of said capacitor and a resistance of an output resistor of said buffer circuit is set to a value smaller than a reciprocal of an allowable maximum frequency of said input signal.

4. The pulse delay circuit according to claim 1, wherein said capacitor is formed by a CMOS process.

5. The pulse delay circuit according to claim 1, wherein each of said delay units is constituted of at least one CMOS inverter gate circuit applied with said input signal as a drive voltage thereof.

6. The pulse delay circuit according to claim 1, wherein each of said delay units is constituted of at least one CMOS inverter gate circuit grounded to said ground line and provided with a current control transistor through which said CMOS gate inverter circuit is connected to a power supply line to be applied with a drive voltage, said signal line being connected to a control terminal of each of said current control transistors so that said drive voltage is applied to each of said delay units as said input signal.

7. The pulse delay circuit according to claim 1, wherein each of said delay units is constituted of a standard logic circuit cell.

8. An A/D converter comprising:
a pulse delay circuit as recited in claim 1; and
an encoding circuit which generates numerical data showing the number of said delay units which said pulse signal has passed through within a predetermined time;
said numerical data being outputted as A/D-converted data representing a voltage level of said input signal.

9. The A/D converter according to claim 8, wherein transistors constituting said pulse delay circuit are larger in size than transistors constituting said encoding circuit.

10. The A/D converter according to claim 8, wherein said delay units are connected in a ring to form a ring delay line, and said encoding circuit includes:
a circulation number counter which counts the number of times that said pulse signal has circulated around said ring delay line;
a lower-bit encoder which outputs data showing a position of said pulse signal within said pulse delay circuit as lower-bit data; and
a higher-bit encoder which outputs data showing a count value of said circulation number counter as higher-bit data.

* * * * *